United States Patent [19]
Yoo et al.

[11] Patent Number: 5,845,108
[45] Date of Patent: Dec. 1, 1998

[54] SEMICONDUCTOR MEMORY DEVICE USING ASYNCHRONOUS SIGNAL

[75] Inventors: Seung-Moon Yoo, Suwon; Ejaz Ul Haq, Yongin-gun, both of Rep. of Korea

[73] Assignee: Samsung Electronics, Co., Ltd., Suwon, Rep. of Korea

[21] Appl. No.: 781,953

[22] Filed: Dec. 19, 1996

[30]     Foreign Application Priority Data

Dec. 22, 1995  [KR]  Rep. of Korea ................. 54759/1995

[51] Int. Cl.$^6$ ................................................... G06F 1/04
[52] U.S. Cl. ......................... 395/551; 395/559; 365/233
[58] Field of Search .................................... 395/551, 552, 395/555, 559, 560; 711/100, 105, 111, 167, 211; 365/189.02, 189.03, 230.02, 233

[56]        References Cited

U.S. PATENT DOCUMENTS 5,262,998  11/1993  Mnich et al. ............................ 365/222
5,596,545  1/1997   Lin ........................................... 365/236
5,640,361  6/1997   Hessel ...................................... 365/233

FOREIGN PATENT DOCUMENTS 0 630 024 A1  12/1994  European Pat. Off. .
2 128 830     5/1994   Germany .

*Primary Examiner*—Dennis M. Butler
*Attorney, Agent, or Firm*—Mager, Johnson, McCollom P.C.

[57]            ABSTRACT

A semiconductor memory device such as a DRAM has an internal oscillator to provide a periodic clock signal. During a read operation, output data is generated synchronized to the internal clock signal, and an external control signal is provided also synchronized to the internal clock signal. A requesting device utilizes the external control signal for fetching data from the memory device at high speed with improved setup and hold time. The control signal output is active only during a read operation, thereby reducing power consumption. Additionally, a common line is used for receiving address, instructions, and data. This drastically reduces the number of pins for interfacing to a memory device.

10 Claims, 5 Drawing Sheets

SEMICONDUCTOR MEMORY DEVICE USING ASYNCHRONOUS SIGNAL

BACKGROUND OF THE INVENTION

1. Field of the Invention

The present invention relates to semiconductor memory, and more particularly to semiconductor memory devices and asynchronous methods of operation of such devices to improve bandwidth while reducing chip area, power consumption and complexity.

2. Description of the Related Art

A semiconductor memory device for storing data includes a number of unit memory elements each having different address. Among various types of memory devices, a DRAM (Dynamic random Access Memory) is widely used due to its high density and a low manufacturing cost per bit. In order to reduce the package size, the DRAM generally employs an address multiplexing system. The DRAM uses the same address pins to receive row and column addresses for addressing a selected memory element, and distinguishes the row address from the column address by using pins for receiving a row address strobe signal RASB (inverse RAS signal) and a column address strobe signal CASB (inverse CAS).

Such a DRAM receives the row and column addresses sequentially in synchronism with the row address strobe signal RAS and the column address strobe CAS respectively, for memory read or write operations. Internally, a row address is received and decoded first to load cell data on a bit line so as to amplify the data, and thereafter selected data is read out responsive to a column address received. Here, it should be noted that a row address received previously must first be reset in order to receive a new address.

Therefore, the DRAM requires a time tRAS for activating the row address strobe signal RASB, a time tRP (RASB precharge time) for resetting a currently latched row address and restoring DRAM data, a time tCAS for reading out column data in sequence, and a time tCP for receiving new column address. Further, a time for reading out the DRAM data is called tRAC (access time from RASB) in the case where the DRAM data is read out beginning with a new row address, and is called tAA (Access Time from Address) in case where the DRAM data is read out beginning with a new column address. FIG. 1 illustrates these timing relationships.

In a known 16 Mega byte DRAM, the tRAC is about 50 ns (nanoseconds), and the tAA is about 25 ns. In the case where the tAA is 25 ns, a data transmission per second is determined by $1/(25 \times 10^9) * 16 = 40 \times 10^6 \times 16 = 80$ Mbyte/sec if it is assumed that the number of the data output pins is 16 and the DRAM operates continuously. In a recent memory system, the speed difference between the DRAM and CPU (Central Processing Unit) becomes a big issue. To address this problem, some memory systems employ a cache memory with a relatively low capacity and high operating speed. However, such a memory system employing the cache memory is more expensive. Further, when the cache memory does not have the desired data (i.e., a cache "miss") the missing data must be read from a main memory (i.e., DRAM), thereby reducing the system speed (increasing latency). Consequently it is necessary to increase the DRAM speed (bandwidth) in order to improve the system performance.

On the other hand, a synchronous DRAM and a RAMBUS DRAM have been proposed as a RAM that controls the memory system using a fast system clock for transmitting the data so as to improve the system performance. Such memory systems may transmit the data with transmission rates of up to 250M bytes or 500M bytes per second, so that the latency during the cache miss state is reduced, thereby improving the overall performance of the memory system. However, such memory systems using the system clock suffer high power consumption, since system bus lines positioned between a controller and the memory always oscillate at a frequency of the system clock, and accordingly some parts of the circuitry are always operating even when the memory in the chip is not being accessed. This relationship is apparent with reference to FIG. 2 which illustrates an operational timing diagram of a synchronous DRAM according to the state of the art.

Referring to FIG. 2, CLK is the external or system clock signal. Internal circuitry (i.e. on board the DRAM chip), for example a clock buffer, operates continuously since the system clock runs continuously. It is apparent from published data sheets that in the synchronous DRAM, the maximum permissible current value when memory is at the stand-by state with the system clock being applied is a few milliamperes; in contrast, the maximum permissible current value when the memory is at the stand-by state with the system clock not being applied is a few tens of milliamperes. In the drawing, an interval "A" shows a state that the memory device operates to generate data 0 and 1 in synchronism with the system clock, and an interval "B" shows another state that the system clock is generated continuously although the memory device does not generate output data.

Furthermore, the memory systems using the system clock have a problem regarding a margin for the setup time and the hold time of the address and data which are synchronized with the system clock. Referring to FIG. 3, shown is an operational timing diagram illustrating the address setup time and hold times according to the state of the art. In case where the frequency of the system clock is 250 MHz and the data is read out or written at both edges of the system clock, the maximum value of the data setup time 10 and the data hold time 20 is 1 ns at the most. In this case, it is very difficult to latch a valid address for the hold time 20 (time for maintaining address signal) of 1 ns. In practice, it takes time to change an external clock of the TTL level into an internal signal of the CMOS level, in the clock buffer. Thus, it is hard to latch the external address. FIG. 4 illustrates an operational timing diagram showing a failed operation resulting from delay in generating the internal clock signal, according to the state of the art. It can be observed in FIG. 4 that delay in generating the internal clock signal A contributes to the latch signal B being asserted after the address is not longer valid. It is also known that the time delay in generating the internal clock increases in proportion to the size of the memory chip.

To solve this problem, it is known to use a phase locked loop (PLL) or a delay locked loop (DLL). With the use of the PLL or DLL, the time delay TD in generating the internal clock "A" may be eliminated and thus, an address latch signal "B" is within the valid address (here, the external address) hold time, thereby ensuring correct operation. However, providing the PLL or DLL circuitry causes increased power consumption (in case of the RAMBUS DRAM) and the PLL or DLL setup time is required when the memory system first starts up following a power-down mode, thus causing a delay in outputting the first generated data. In conclusion, existing asynchronous DRAM has very low data transmission speed, and a synchronous DRAM proposed to solve that problem has excessive power consumption due to the continuous operation of the circuitry associated with internal clock generation. Further, the synchronous DRAM has a problem regarding the setup time and hold time with respect to the fast clock. When employing the PLL or DLL circuitry, the synchronous DRAM will have another problem of an increase of the power consumption and the chip layout.

SUMMARY OF THE INVENTION

It is therefore an object of the present invention to provide a semiconductor memory device using an asynchronous data output signal so as to provide adequate setup time and hold time. The data output signal is generated by an internal oscillator circuit. This has the advantage of reducing power because the data out signal need only be provided during a data read operation. The output data DQ is synchronized to the data out internal clock signal. This approach obviates the bus (clock) lines which always operate in the conventional synchronous memory.

According to another aspect of the present invention, a semiconductor memory device has a novel interface for reducing pin count. The interface includes a control signal line and a common line. Transitions of the control signal line are used to clock row address data, instructions (OPcodes), column address data, and actual user data sequentially onto the common line. Thus the common line is used for all three: address, data and control information, thereby drastically reducing DRAM pin count. The "common line" of course does not necessarily imply a single line; it may be, e.g. 16 or 32 or more bits wide.

As mentioned above, the improved memory device includes an oscillator for generating an internal signal with a predetermined period; means for processing the latched address signals, input data and commands in association with said internal signal; and a second signal for indicating a data output time point during a data output operation; whereby a read and write operation from/to a memory is performed in response to the period of said oscillator and the second signal is generated separately from the output data.

BRIEF DESCRIPTION OF THE DRAWINGS

The above and other objects, features and advantages of the present invention will become more apparent in the light of the following detailed description of an exemplary embodiment thereof taken with the attached drawings in which.

DETAILED DESCRIPTION OF THE PREFERRED EMBODIMENT

A semiconductor memory device using an asynchronous signal according to an embodiment of the present invention will be described in detail hereinbelow with reference to the attached drawings, wherein the like numerics and abbreviations express the like elements.

Figure 1:
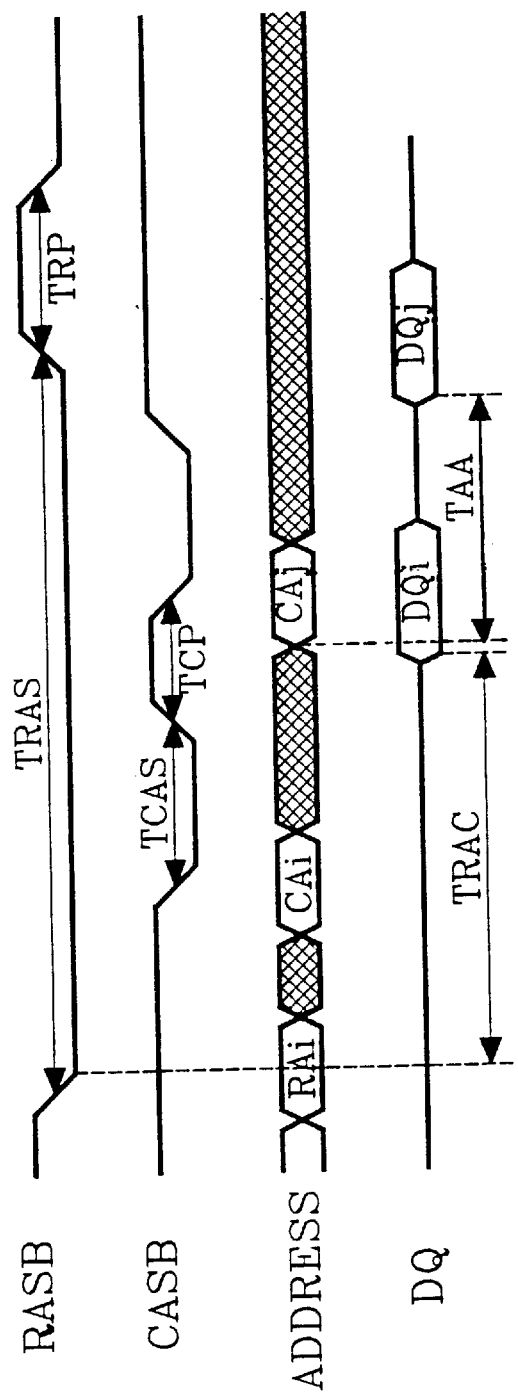
FIG. 1 is a basic operational timing diagram of a DRAM according to the prior art.
Figure 2:
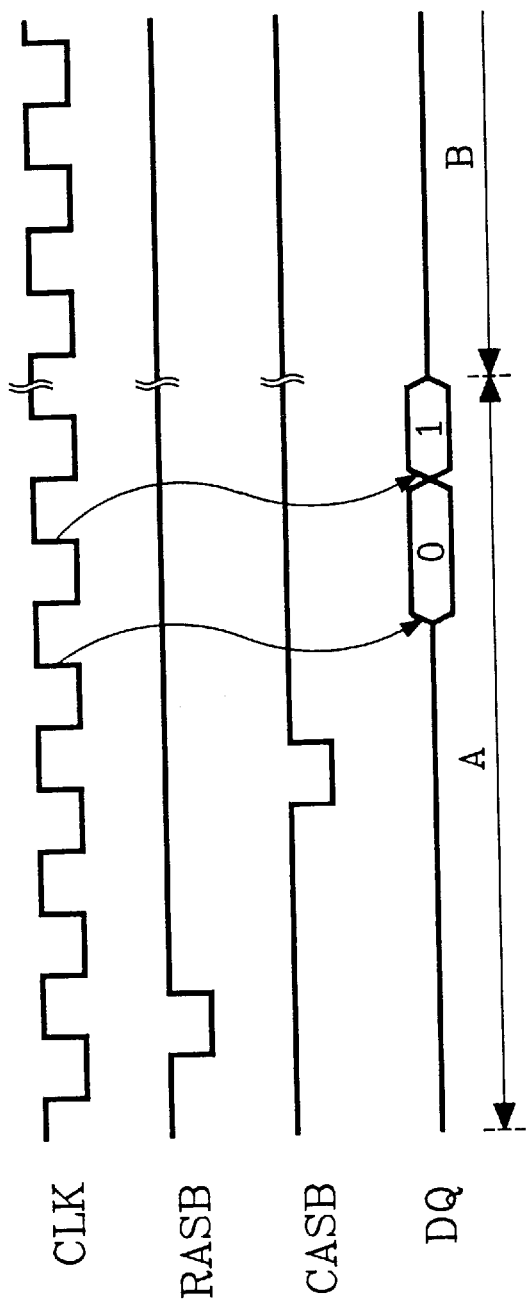
FIG. 2 is an operational timing diagram of a synchronous DRAM according to the prior art.
Figure 3:
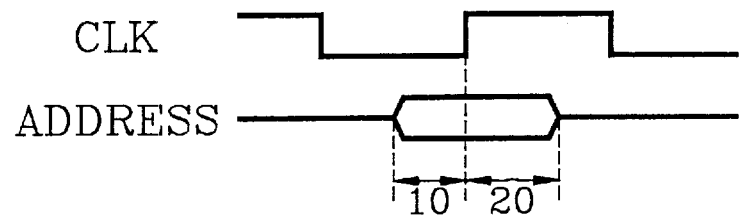
FIG. 3 is an operational timing diagram showing an address setup time and hold time according to the prior art.
Figure 4:
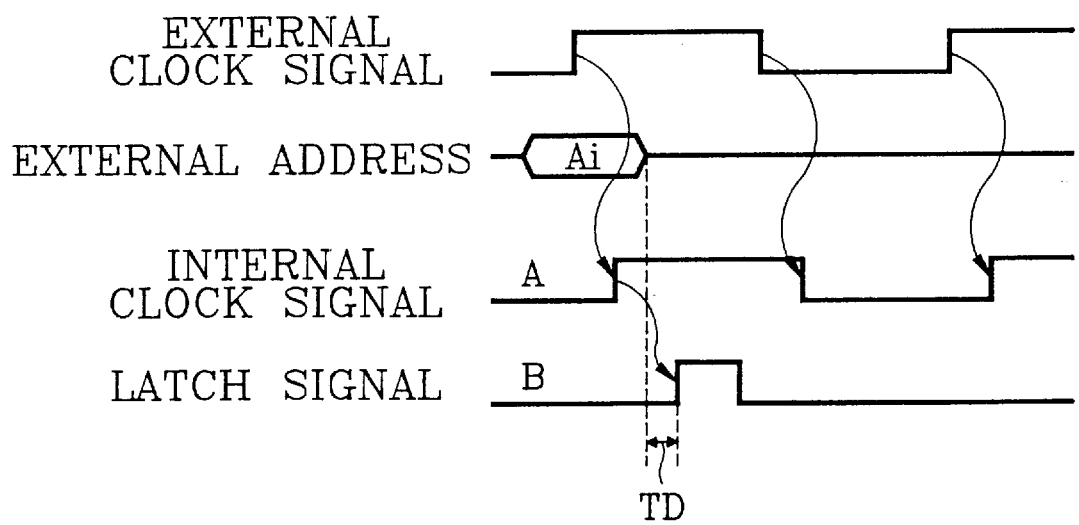
FIG. 4 is an operational timing diagram showing a fail state caused due to a delay in generating an internal clock according to the prior art.
Figure 5:
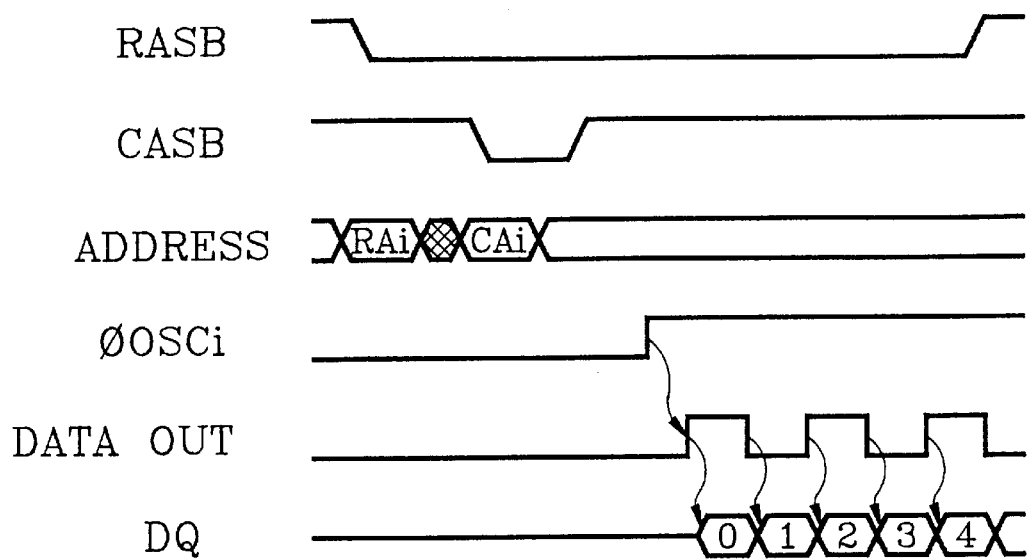
FIG. 5 is an operational timing diagram of a DRAM according to an embodiment of the present invention.

Referring first to FIG. 5, a DRAM according to an embodiment of the present invention receives an address and input data with a sufficient time margin (setup time and hold time) as in the conventional asynchronous DRAM. Therefore, when the memory system goes to a state that can transmit the data with the setup time and hold time as stated above, a high speed oscillator provided in the memory system generates to the exterior the output data DQ and a reference signal DATA OUT simultaneously. DATA OUT is used by the external system to fetch the data from the memory. In this way, the problem which may rise during transmitting the data at high speed can be solved. Namely, in case where the data is outputted in synchronism with a high speed external clock (this clock is concerned in operation of the DRAM and a controller), the data setup time and hold time are important in fetching safely the data from the external controller and the DRAM. In particular, the data hold time is very important because it is a time for which the external controller can fetch the data. Here, rather than impose challenging setup and hold time constraints on the memory, the memory itself provides essentially an output clock for high speed transmission that is synchronized to the generation of data.

In the DRAM, it is very difficult to load the data precisely in association with the fast clock because of circuit parameter variations responsive to temperature and the manufacturing process, and it becomes increasingly difficult as the frequency of the external clock increases. However, as mentioned above, when the data is outputted at the same time using the internally generated signal (instead of being synchronized with the external clock), the external controller fetches the data only at an instant for which the data is generated and therefore, the DRAM generates the output data simultaneously. As a result, it is possible to maximize data hold time. Further, since the data is always generated together with the internal signal, the memory device will not be affected by changes of the temperature and manufacturing process. In other words, it is self-compensating, although the frequency of the oscillator must be limited to a maximum frequency range that the external controller can accomodate. It is therefore apparent from the above description that the DRAM operates asynchronously to generate output data in association with the fast output signal from the internal oscillator so as to generate the output signal to the exterior of the chip only when necessary (i.e., only when the data is generated). Further, since the data output signal DATAOUT can be generated independent of the external clock and generated only when necessary, the memory system according to the present invention may be easy to control and does not need to include the PLL or DLL circuitry, thereby lowering the power consumption. As a result, the memory system according to the present invention has advantages of lowering the power consumption, increasing the setup and hold time, and securing an easy control thereof. In addition, if incorporated with a packet method, the inventive memory device can be controlled with a reduced number of pins.

Figure 6:
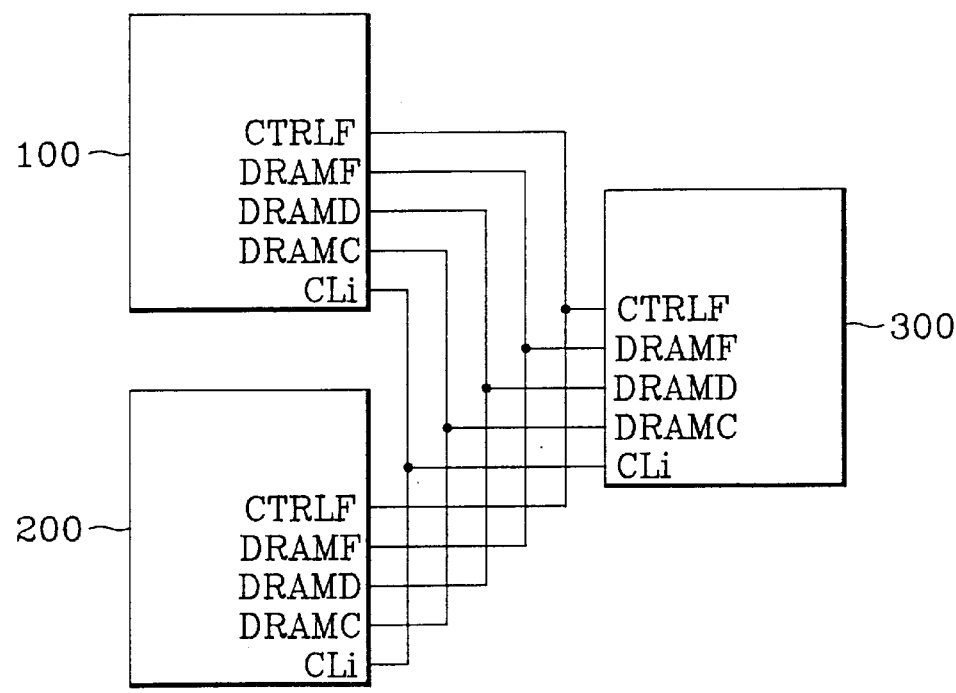
FIG. 6 is an exemplary diagram of a DRAM system according to an embodiment of the present invention.

Referring to FIG. 6, a DRAM memory system according to an embodiment of the present invention includes a DRAM 300 which is connected in common to a DRAM controller 100 and a graphic controller 200. The DRAM controller 100, the graphic controller 200, and the DRAM 300 include pins for indicating status, respectively. Specifically, the DRAM system includes a DRAMF signal for indicating as to whether the DRAM 300 is accessed by a different controller (100 or 200) to confirm that the DRAM 300 is in a status capable of transmitting and receiving data to/from the controllers 100, 200. In short, DRAMF acts as a DRAM ready/busy signal. A CTRLF signal indicates whether the controllers 100, 200 can receive the data from the DRAM 300. Thus, the DRAM controller 100 checks a status of the DRAMF signal first to access the DRAM 300 for reading out the data. In the specification, the DRAMF signal of the logic high state indicates that the DRAM 300 is accessed by a different controller (100 or 200) and in contrast, the DRAMF signal of the logic low state indicates that the DRAM 300 is not accessed by the controllers. Namely, the DRAM controller 100 checks the logic state of the DRAMF signal to access the DRAM 300 in case where the DRAMF signal is at the logic low state. Once the DRAM 300 is accessed, the DRAM 300 generates the DRAMF signal of the logic high state to notify a status that the DRAM 300 is being accessed. At this moment, since the DRAMF signal is at the logic high state indicating that the DRAM 300 is being accessed by a different controller (i.e., the DRAM controller 100), the graphic controller 200 can not access the DRAM 300 and goes to a waiting state.

In order to control the DRAM 300, the DRAM controller 100 transmits data such as a read/write signal, a starting and ending address of the row and column address, and a data sequence by loading them as one or more packets of data. This information is clocked onto a common line CLi under direction of a DRAMC control signal of the DRAM controller 100. For example, a row starting address is transmitted at a first falling edge of the DRAMC signal onto the common line CLi between the controllers 100, 200 and the DRAM 300. An OP code including a read/write signal is transmitted at a second falling edge of the DRAMC signal, and a column starting address is transmitted at a third falling edge of the DRAMC signal. The common line CLi is also used when transmitting data from the DRAM 300 to the DRAM controller 100. Since the same line is used for communicating the address and data, as well as control information, the pins are drastically reduced in number compared with the conventional DRAM having address pins, control pins, and data pins, separately. Further, it is not necessary to transmit at high speed the data from the controller to the DRAM 300, and the non-synchronous controller generates the DRAMC signal in association with a low frequency at which the DRAM 300 can fetch the data without the PLL or DLL circuitry. Thus, the problem which may rise when transmitting the data in synchronism with the very fast clock in the conventional memory system may be solved.

The data transmission from the controller to the DRAM is carried out in response to a CTRLD signal, in which the frequency of the CTRLD signal is determined according to a capability of the DRAM. Thereafter, the DRAM 300 transmits the output data together with a DRAMD signal generated from the DRAM 300, via the common line CLi. The DRAM 300 checks a status of the controller, to allow the DRAM to generate the output data if the CTRLF signal is at the logic high state (indicating a state that the controller can access the DRAM to read the data), and otherwise, to allow the DRAM to go to a waiting state if the CTRLF signal is at the logic low state (indicating a state that the controller has another job). Here, since the DRAMD signal and the output data are generated at the same time, the data hold time of the DRAM seen from a standpoint of the controller is maximized, thereby securing a safe fetch of the data from the DRAM.

The DRAMD signal is internally generated from the DRAM, which includes a compensation circuit (not shown) for compensating the DRAMD signal for changes of the temperature and the manufacturing process. The data transmission ratio (transmission speed) is variable according to the type of the system bus and the capability of the controller. Further, after the data transmission is completed from the DRAM to the controller, the DRAMD signal goes to the logic low state to prevent the system bus from swinging, and the DRAMF signal also goes to the logic low state to notify that the DRAM is now free to perform a next job.

Figure 7A:
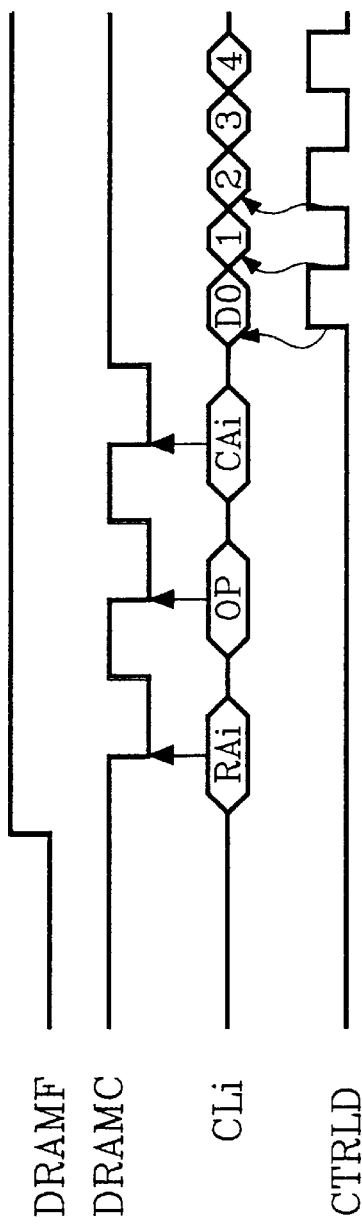
FIGS. 7A and 7B are operational timing diagrams showing a data write-in operation in the memory system of FIG. 6 according to an embodiment of the present invention.
Figure 7B:
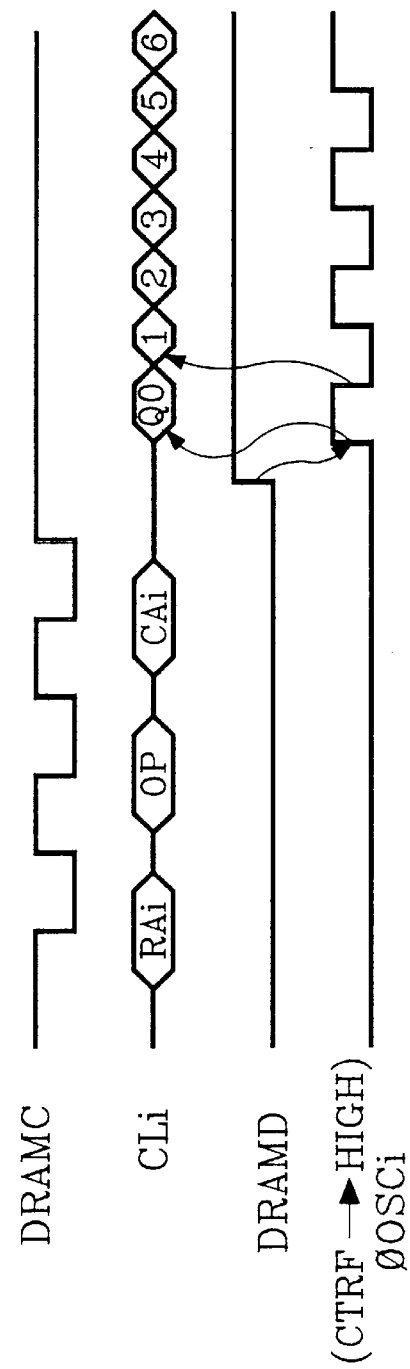

Referring to FIGS. 7A and 7B, shown are operational timing diagrams illustrating a data write-in operation in the memory system of FIG. 6 according to an embodiment of the present invention. In detail, FIG. 7A shows an operational timing diagram of a data write operation from the controller to the DRAM, and FIG. 7B shows an operational timing diagram of a data write operation from the DRAM to the controller. In conclusion, the conventional asynchronous DRAM is not suitable for a high speed data transmission due to its low access speed. Further, the conventional synchronous DRAM has a problem of the continuous generation of the clock signal and complexity of the circuitry. However, since the DRAM system according to the present invention employs an asynchronous DRAM, the problems of the setup and hold time which may rise in the conventional synchronous DRAM may be solved. Further, since the inventive DRAM system generates the data together with the output signal at the same time in association with the fast oscillation signal generated internally, the data is generated with a maximum hold time only when necessary so that the problem of the continuous swing of the bus may be solved and the data can be transmitted at high speed. Moreover, the inventive DRAM system does not need the PLL or DLL circuit, so that the power consumption and the chip layout may be reduced drastically.

The preferred embodiment is given by way of example, and as a means for explaining the use and making of the present invention. The embodiment is subject to routine modification by those of ordinary skill in the art. The present invention is not limited to the illustrative embodiment, but is defined by the appended claims.

What is claimed is:

1. A semiconductor memory device comprising:
   an internal oscillator for generating a periodic internal clock signal;
   data output means for generating output data synchronized to the internal clock signal; and
   means for providing a data out signal to the exterior of the device, the data out signal being responsive to the internal clock signal and synchronized to the data output means, whereby an external controller can utilize the data out signal for synchronously fetching the output data from the data output means.

2. A semiconductor memory device according to claim 1 wherein the means for providing the data out signal to the exterior of the device is disabled except during a memory read operation thereby reducing power consumption.

3. A semiconductor memory device comprising:
   a control signal input for receiving an externally applied control signal (DRAMC);
   a common line for receiving both address information and an operating instruction;
   means for latching address information into the memory from the common line responsive to a first transition of the control signal; and means for receiving an operating instruction into the memory from the common line responsive to a second transition of the control signal; whereby the number of memory device pins is reduced.

4. A semiconductor memory device according to claim 3 wherein the means for latching address information into the memory includes row address means for latching a row address responsive to one transition of the control signal and column address means for latching a column address responsive to another transition of the control signal.

5. A semiconductor memory device according to claim 3 wherein the common line is arranged to receive both address information and data; and the memory device further includes means for receiving a controller data signal (CTRLD) and means for clocking data into the memory device from the common line responsive to transitions of the controller data signal in a write operation.

6. A semiconductor memory device according to claim 3 wherein the common line comprises a bidirectional port.

7. A method of reading data from a random access semiconductor memory device comprising the steps of:

providing an on-board oscillator in the memory device to generate an internal periodic signal;

during a read operation, generating output data synchronized to the internal periodic signal; and during the read operation, generating a data out control signal synchronized to the internal periodic signal, whereby an external device or controller can utilize the data out control signal for fetching the output data at the speed of the internal periodic signal.

8. A method according to claim 7 further comprising timing the data out signal so as to provide a transition on the data out signal substantially at the beginning of each output data valid time, thereby maximizing the effective hold time from the perspective of the said external device or controller.

9. A DRAM system comprising:

a memory controller;

a DRAM; and a graphics controller;

a DRAM ready signal line (DRAMF) interconnecting the memory controller, the DRAM and the graphics controller for indicating whether the DRAM is available;

a controller ready signal line (CTRLF) interconnecting the memory controller, the DRAM and the graphics controller for indicating whether the controller is available; and a common line or bus (CLi) interconnecting the memory controller, the DRAM and the graphics controller for transferring both address and data information between any of the said memory controller, the DRAM and the graphics controller.

10. A DRAM system according to claim 9 further comprising:

a second control signal (DRAMD) provided by the DRAM and connected to the said controller and to the graphics controller for clocking data out of the DRAM synchronized to an internal DRAM oscillator circuit.

* * * * *